United States Patent
Kamijo

(10) Patent No.: US 8,558,454 B2
(45) Date of Patent: Oct. 15, 2013

(54) LIGHT-EMITTING DEVICE

(71) Applicants: Citizen Electronics Co., Ltd., Fujiyoshida (JP); Citizen Holdings Co., Ltd., Nishi-Tokyo (JP)

(72) Inventor: Yu Kamijo, Fujiyoshida (JP)

(73) Assignees: Citizen Electronics Co., Ltd., Yamanashi-Ken (JP); Citizen Holdings Co., Ltd, Tokyo (JP)

( * ) Notice: Subject to any disclaimer, the term of this patent is extended or adjusted under 35 U.S.C. 154(b) by 0 days.

(21) Appl. No.: 13/624,198

(22) Filed: Sep. 21, 2012

(65) Prior Publication Data

US 2013/0069518 A1 Mar. 21, 2013

(30) Foreign Application Priority Data

Sep. 21, 2011 (JP) ................ 2011-205423

(51) Int. Cl.
*H01J 1/62* (2006.01)
(52) U.S. Cl.
USPC .......................... 313/506; 313/498

(58) Field of Classification Search
USPC ................. 313/506, 498, 509, 512
See application file for complete search history.

(56) References Cited

U.S. PATENT DOCUMENTS

2003/0107316 A1* 6/2003 Murakami et al. ............ 313/512

FOREIGN PATENT DOCUMENTS

JP 10-135492 A 5/1998

* cited by examiner

*Primary Examiner* — Vip Patel
(74) *Attorney, Agent, or Firm* — Browdy and Neimark, PLLC

(57) ABSTRACT

A light-emitting device includes a rectangular substrate, a through-holes that is in a shape of a quarter of circle provided in two corners or four corners of the substrate, a pair of electrodes provided along short sides of the substrate and electrically connected to the through-hole(s) that is adjacently disposed to each of the electrodes. Each of the through-holes is covered by a cover that is in a shape of a quarter of circle.

8 Claims, 6 Drawing Sheets

LIGHT-EMITTING DEVICE

CROSS REFERENCE TO RELATED APPLICATION

This application is based on and claims the priority benefit of Japanese Patent Application No. 2011-205423, filed on Sep. 21, 2011, the disclosure of which is incorporated herein by reference in its entirety.

BACKGROUND OF THE INVENTION

1. Field of the Invention

The present invention relates to a light-emitting device configured to be used as a light source of a lighting device and/or an electronic device such as a backlight for displays, portable devices, and so on, in particular, to a light-emitting device including through-holes and to be mounted on a board of a lighting device and/or an electronic device.

2. Description of the Related Art

A conventional light-emitting device including a substrate having a rectangular shape as viewed in a top plan, and an electronic element disposed on a central portion of an upper surface of the substrate is known (for example, see JPH10-135492). The electronic element is directly mounted on one of a pair of upper electrodes of the substrate and connected to the other of the pair of upper electrodes the substrate by a wire for electrical connection. Through-holes each in a shape that is a semicircle as viewed in a top plan view are provided in two opposite sides (right and left sides) of the substrate.

In the light-emitting device, two dry films are disposed on the upper surface of the substrate along the two opposite sides to cover the through-holes from above to prevent a light-transmitting resin that is to be provided on the upper surface of the substrate from entering the through-holes. Each of the two dry films has a rectangular shape and the same length as a length of each of opposite sides of the substrate. The light-transmitting resin is disposed on the upper surface of the substrate and upper surfaces of the two dry films provided on the upper surface of the substrate to seal the electronic element.

However, in the conventional light-emitting device, because the electronic element, the through-holes each in a shape of a semicircle, the dry films each in a shape of the rectangular with the same length as the length of each of the opposite sides of the substrate and covering the through-holes from above, the substrate tends to be larger to secure a space for a capillary to perform wire bonding(s) at position(s) between the dry films and the light-emitting element during a process manufacturing a light-emitting device.

This is contrary to a demand of miniaturization of a light-emitting device in a market.

SUMMARY OF THE INVENTION

The present invention is provided in view of the aforementioned problems. A light-emitting device according to an embodiment of the present invention includes a substrate that includes an upper surface, a lower surface opposite to the upper surface, a peripheral side surface extending between peripheral edges of the upper surface and peripheral edges of the lower surface, a pair of electrodes as a first electrode and a second electrode that are disposed on the upper surface of the substrate, and a light-emitting element that includes a pair of element electrodes as a first element electrode and a second element electrode and disposed on the second electrode of the substrate.

The light-emitting device according to the embodiment of the present invention further includes a pair of wires as a first wire and a second wire, the first wire electrically connecting the first electrode of the substrate and the first element electrode of the light-emitting element, and the second wire electrically connecting the second electrode of the substrate and the second element electrode of the light-emitting element, and a first through-hole in a shape that is a quarter of circle disposed at a first corner of the substrate and electrically connected to the first electrode of the substrate, and a second through-hole in a shape that is quarter of circle disposed at a second corner that is diagonally opposite to the first corner of the substrate and electrically connected to the second electrode of the substrate, and a first cover in a shape that is a quarter of circle disposed on the upper surface of the substrate and covering the first through-hole at the first corner of the substrate, and a second cover in a shape that is a quarter of circle disposed on the upper surface of the substrate and covering the second through-hole at the second corner of the substrate.

According to another embodiment of the present invention, the light-emitting device may include a third through-hole in a shape that is a quarter of circle disposed at a third corner of the substrate and electrically connected to the first electrode of the substrate, a fourth through-hole in a shape that is a quarter of circle disposed at a fourth corner diagonally opposite to the third corner of the substrate and electrically connected to the second electrode of the substrate, a third cover in a shape that is a quarter of circle disposed on the upper surface of the substrate and covering the third through-hole disposed at the third corner of the substrate, a fourth cover in a shape that is a quarter of circle disposed on the upper surface of the substrate and covering the fourth through-hole at the fourth corner of the substrate.

DETAILED DESCRIPTION OF THE EMBODIMENTS

The following detailed description refers to the accompanying drawings, which illustrate specific embodiments of the invention. Other embodiments including different structures and operation do not depart from the scope of the present invention.

Embodiments of the invention are described with reference to drawings included herewith. Like reference numbers refer to like structures throughout. It should be noted that the drawings are schematic in nature. Not all parts are always shown to scale.

Figure 4:
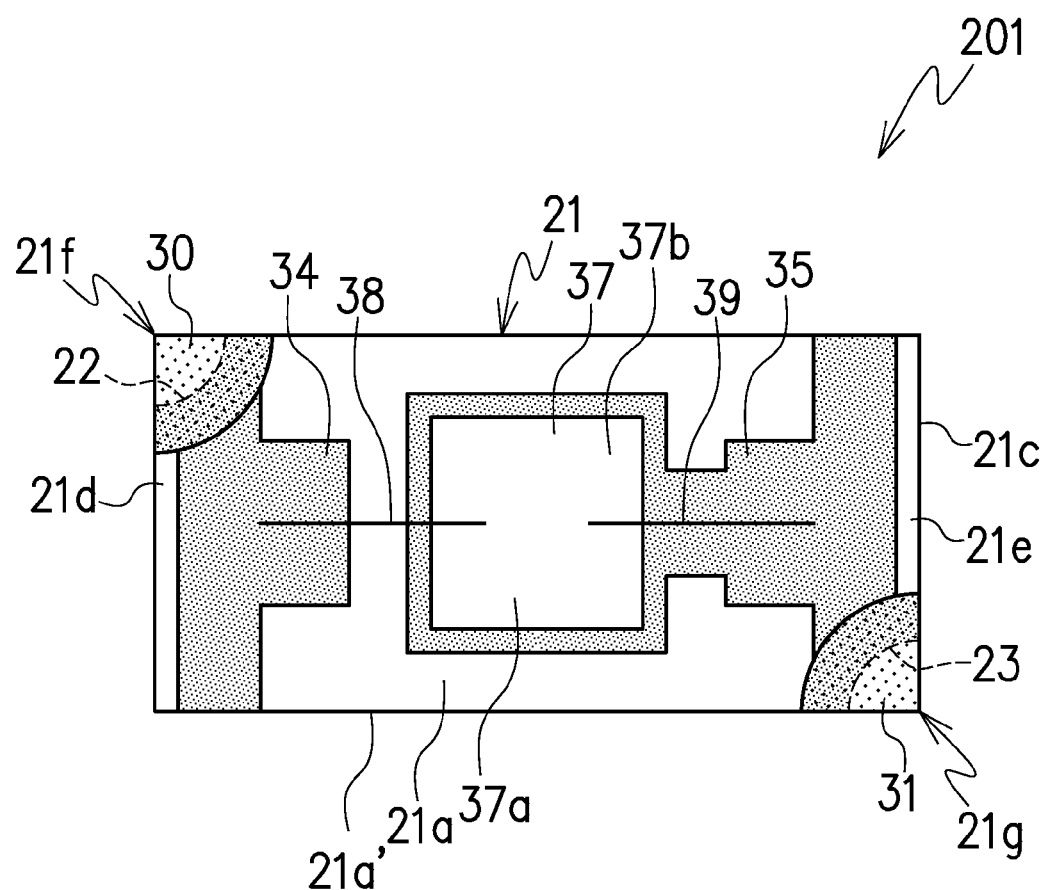
FIG. 4 is a plan view showing a light-emitting device according to a second embodiment of the present invention, in which a through-hole that is in a shape of a quarter of circle is provided in each of two diagonally opposite corners of four corners of a rectangular substrate.

As shown in FIG. 4, a light-emitting device 201 including a substrate 21 that includes an upper surface 21a, a lower surface 21b opposite to the upper surface 21a, a peripheral side surface 21c extending between peripheral edges 21a' of the upper surface 21a and peripheral edges 21b' of the lower surface 21b, a pair of electrodes as a first electrode 34 and a second electrode 35 that are disposed on the upper surface 21a of the substrate 21, a light-emitting element 37 including a pair of element electrodes as a first element electrode 37a and a second element electrode 37b and disposed on the second electrode 35 of the substrate 21, a pair of wires as a first wire 38 and a second wire 39, the first wire 38 electrically connecting the first electrode 34 of the substrate 21 and the first element electrode 37a of the light-emitting element 37, and the second wire 39 electrically connecting the second electrode 35 of the substrate 21 and the second element electrode 37b of the light-emitting element 37, and a first through-hole 22 in a shape that is a quarter of circle in a top plan view disposed at a first corner 21f of the substrate 21 and electrically connected to the first electrode 34 of the substrate 21, a second through-hole 23 in a shape that is a quarter of circle in a top plan view disposed at a second corner 21g that is diagonally opposite to the first corner 21f of the substrate 21 and electrically connected to the second electrode 35 of the substrate 21, a first cover 30 in a shape that is a quarter of circle disposed on the upper surface 21a of the substrate 21 and covering the first through-hole 22 at the first corner 21f of the substrate 21, and a second cover 31 in a shape that is a quarter of circle disposed on the upper surface 21a of the substrate 21 and covering the second through-hole 23 at the second corner 21g of the substrate 21.

Figure 1:
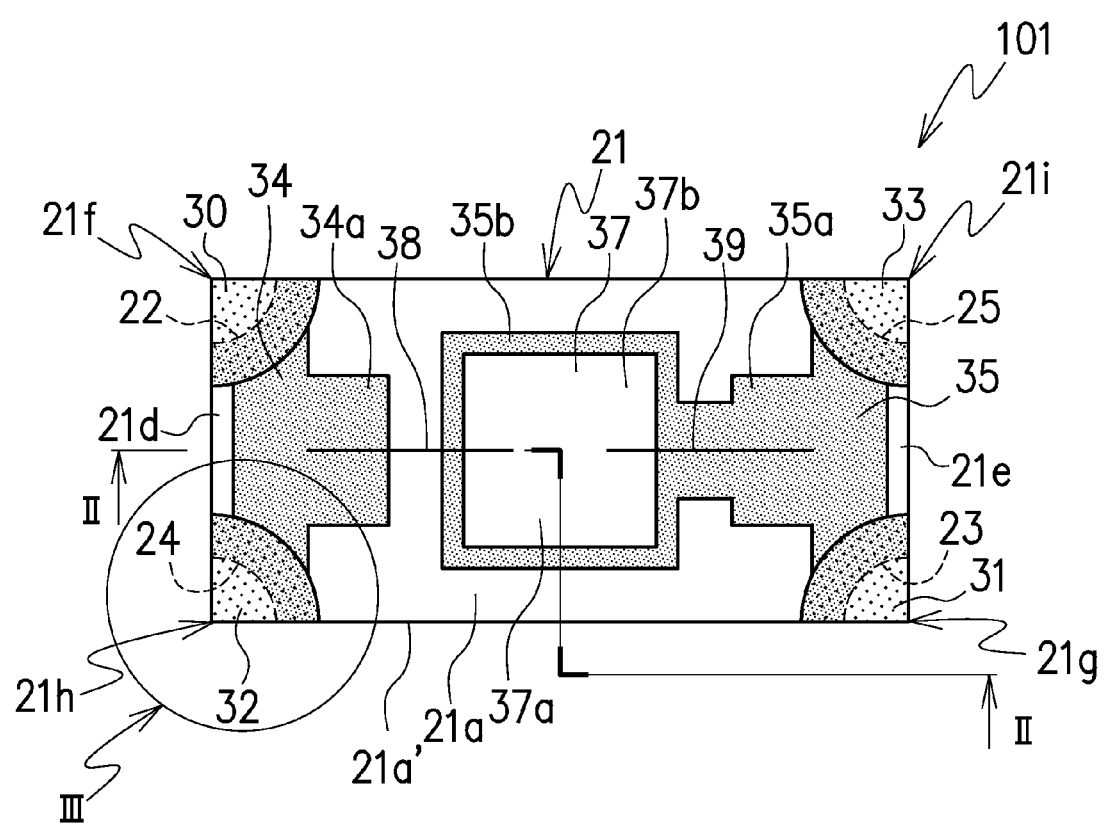
FIG. 1 is a plan view showing a light-emitting device according to a first embodiment of the present invention, in which a through-hole that is in a shape of a quarter of circle is provided in each of four corners of a rectangular substrate.

As shown in FIG. 1, the light-emitting device 101 may further include a third through-hole 24 in a shape that is a quarter of circle in a top plan view disposed at a third corner 21h of the substrate 21 and electrically connected to the first electrode 34 of the substrate 21, a fourth through-hole 25 disposed at a fourth corner 21i diagonally opposite to the third corner of the substrate 21 and electrically connected to the second electrode 35 of the substrate 21, a third cover 32 in a shape that is a quarter of circle disposed on the upper surface 21a of the substrate 21 and covering the third through-hole 24 at the third corner 21h of the substrate 21, a fourth cover 33 in a shape that is a quarter of circle disposed on the upper surface 21a of the substrate 21 and covering the fourth through-hole 25 at the fourth corner 21i of the substrate 21.

The first wire 38 is bonded to the first electrode 34 of the substrate 21 at a position between the first cover 30 and the third cover 32, and the second wire 39 is bonded to the second electrode 35 of the substrate 21 at a position between the second cover 31 and the fourth cover 33.

Figure 2:
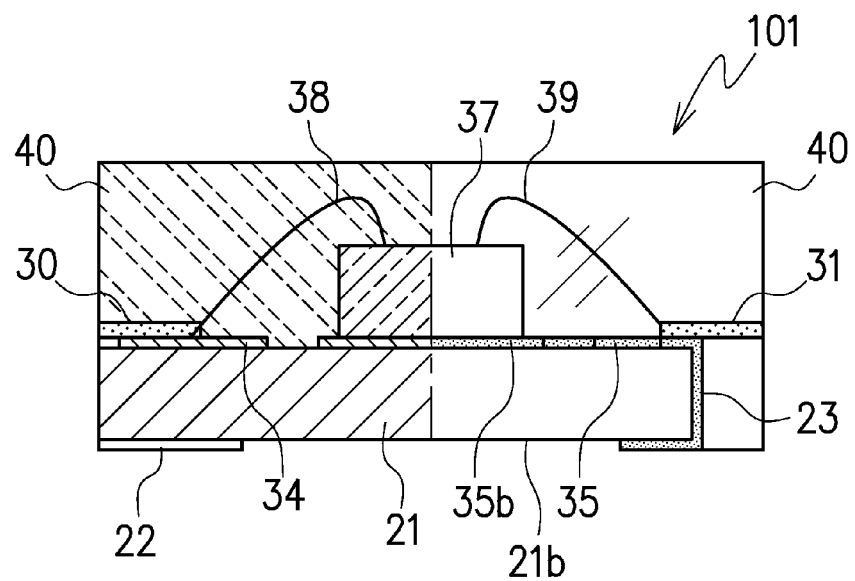
FIG. 2 is a sectional view taken along line II-II of the light-emitting device shown in FIG. 1.
Figure 3:
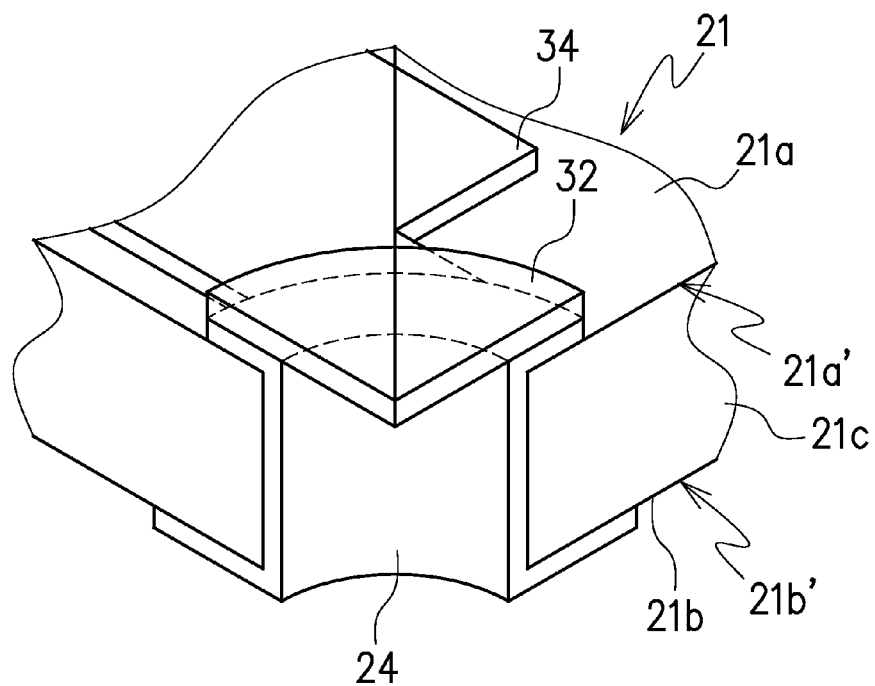
FIG. 3 is an enlarged portion of a portion DI of the light-emitting device shown in FIG. 1.

For more details, FIGS. 1 to 3 illustrate a light-emitting device according to a first embodiment of the present invention.

The substrate 21 includes an insulating material such as a resin, ceramic, organic material and so on. The substrate 21 includes a rectangular shape as viewed in a top plan view. There are four through-holes 22, 23, 24, 25 each in a shape that is a quarter of circle in a top plan view in four corners of the rectangular substrate 21. The peripheral surface of the substrate 21 includes a first side 21d and a second side 21e that is opposite to the first side 21d, a third side and a fourth side that is opposite to the third side, and the first side as the first short side 21d and the second side as the second short side 21e are shorter than the third side and the fourth side of the substrate 21. The first side 21d of the substrate includes a space free from the first cover 30 and the third cover 32 in a direction of bonding the first wire 38 from the first element electrode to the first electrode 37a of the substrate 21. Also, the second side 21e of the substrate 21 includes a space free from the second cover 31 and the fourth cover 33 in a direction of bonding the second wire 39 from the second element electrode 37b to the second electrode 35 of the substrate 21.

Each of the first through-hole 22, the second through-hole 23, the third through-hole 24, and the fourth through-hole 25 includes a conductive layer that is formed in an inner circumferential surface of each of the through-holes and extended to the upper surface 21a of the substrate 21 in a shape of an arc strip portion around each of the first through-hole 22, the second through-hole 23, the third through-hole 24, and the fourth through-hole 25. The arc strip portion around the first through-hole 22 is flush with an arc side of the first cover 30 at an outer arc of the arc strip portion. The arc strip portion around each of the through-holes each in a shape that is a quarter of circle is flush with an arc side of the corresponding through hole at an outer arc of the arc strip portion. The conductive layers may be formed, for example, by printing, plating, and so on Each of the first cover 30, the second cover 31, the third cover 32, and the fourth cover 33 may include a resist, may be a dry film, and so on.

The first electrode 34 and the second electrode 35 disposed on the upper surface 21a of the substrate 21 may be formed, for example, by printing, plating and so on. The first electrode 34 of the substrate 21 extends along the first short side 21d of the rectangular substrate 21. The first electrode 34 extends at a first end of the first electrode 34 adjacent to the first through-hole 22 and extends at a second end of the first electrode 34 adjacent to the third through-hole 24. In addition, the first electrode 34 includes a first inward extension 34a extending from a central portion between the first through-hole 22 and the third through-hole 24 toward a central portion of the upper surface 21a of the substrate 21 (see FIG. 1).

On the other hand, the second electrode 35 of the substrate 21 extends along the second short side 21e of the rectangular substrate 21. The second electrode 35 extends at a first end of the second electrode 35 adjacent to the second through-hole 23 and extends at a second end of the second electrode 35 adjacent to the fourth through-hole 25 (see FIG. 1).

In addition, the second electrode 35 includes a second inward extension 35a extending from a central portion between the second through-hole 23 and the fourth through-hole 25 toward the central portion of the upper surface 21a of the substrate 21. The second electrode 35 may include a central electrode portion 35b extended from the inward extension 35a. The light-emitting element 37 may be mounted on the central electrode portion 35b of the second electrode 35 (see FIG. 1).

Consequently, in the first embodiment, the first electrode 34 provided on the upper surface 21a of the substrate 21 is electrically connected to the first through-hole 22 and the third through-hole 24, and the second electrode 35 is electrically connected to the second through-hole 23 and the fourth through-hole 25.

In addition, in the first embodiment, the central electrode portion 35b extended from the second electrode 35 includes a square or rectangular shape slightly larger than that of the light-emitting element 37 as viewed in a top plan view, and the light-emitting element 37 is bonded on the central electrode portion 35b. The first element electrode 37a of the light-emitting element 37 is electrically connected to the first electrode 34 of the substrate 21 by the first wire 38, and the second element electrode 37b of the light-emitting element 37 is electrically connected to the second electrode 35 of the substrate 21 by the second wire 39 (see FIG. 1).

Reference number 40 shows a light-transmitting resin. The light-transmitting resin 40 may include a epoxy resin, or silicone resin and so on to cover the upper surface 21a of the substrate 21.

When sealing the upper surface 21a of the substrate 21 by the light-transmitting resin 40, the first cover 30, the second cover 31, the third cover 32, and the fourth cover 33a prevent the light-transmitting resin 40 from flowing in the first through-hole 22, the second through-hole 23, the third through-hole 24 and the fourth through-hole 25. The light-transmitting resin 40 is configured to seal the light-emitting element 37, the first wire 38, and the second wire 39 to be attached firmly to the upper surface 21a of the substrate 21 and upper surfaces of the first cover 30, the second cover 31, the third cover 32, and the fourth cover 33.

FIG. 4 illustrates a light-emitting device according to a second embodiment of the present invention.

The light-emitting device 201 in the second embodiment differs the light-emitting device 101 in that, for example, there are only two through-holes each in a shape that is a quarter of circle in a top plan view and diagonally opposite to each other. The first through-hole 22 and the second through-hole 23 are provided in two diagonally opposite corners of the substrate 21. Of course, instead of the first through-hole 22 and the second through-hole 23, the third through-hole 24 and the fourth through-hole 25 may be provided.

In this way, two through-holes may be provided in the two corners of the substrate 21 according to the second embodiment of the present invention. Since the first through-hole 22 with the first cover 30 covering the first through-hole 22 and the second through-hole with the second cover 31 covering the second through-hole 23 are diagonally disposed, there is an enough space for wire bonding(s) by a capillary without increasing the size of the substrate 21. The peripheral surface of the substrate 21 includes a first side 21d and a second side 21e that is opposite to the first side 21d, a third side and a fourth side that is opposite to the third side, and the first side as the first short side 21d and the second side as the second short side 21e are shorter than the third side and the fourth side of the substrate 21. The first side 21d of the substrate includes a space free from the first cover 30 in a direction of bonding the first wire 38 from the first element electrode to the first electrode 37a of the substrate 21. Also, the second side 21e of the substrate 21 includes a space free from the second cover 31 in a direction of bonding the second wire 39 from the second element electrode 37b to the second electrode 35 of the substrate 21.

The light-emitting device 201 in the second embodiment includes a first electrode 34 of the substrate 21 extends along the first short side 21d of the rectangular substrate 21, and a second electrode 35 extends along the second short side 21e of the substrate 21. The first electrode 34 extends at a first end of the first electrode 34 adjacent to the first through-hole 22 and extends at a second end of the first electrode 34 adjacent to a third corner 21h of the substrate 21, and the second electrode 35 extends at a first end of the second electrode 35 adjacent to the second through-hole 23 and extends at a second end of the second electrode 35 to a fourth corner 21i of the substrate 21.

A wire bonding for connecting the light-emitting element to the first and second electrodes is described hereinafter.

For example, after a capillary 11 (as shown in FIG. 11) bonds one end of the first wire 38 that is drawn from an end of the capillary 11 to the first element electrode 37a of the light-emitting element 37, the first wire 38 is extended by the capillary 11 toward a central portion of the first electrode 34 and cut by the capillary 11 pressing the first wire 34 from the end of the capillary 11 against the central portion of the first electrode 34.

When the capillary 11 cuts a wire drawn out of the end of the capillary 11 on an electrode, the end portion of capillary 11 is pressed against the electrode. If there is a cover positioned around or adjacent to a way that a capillary moves or in a direction of a wire is bonded, there is a possibility that the capillary comes to contact with the cover(s). In this case, an error may occur in the wire bonding, and causes a malfunction of a light-emitting device.

Figure 5:
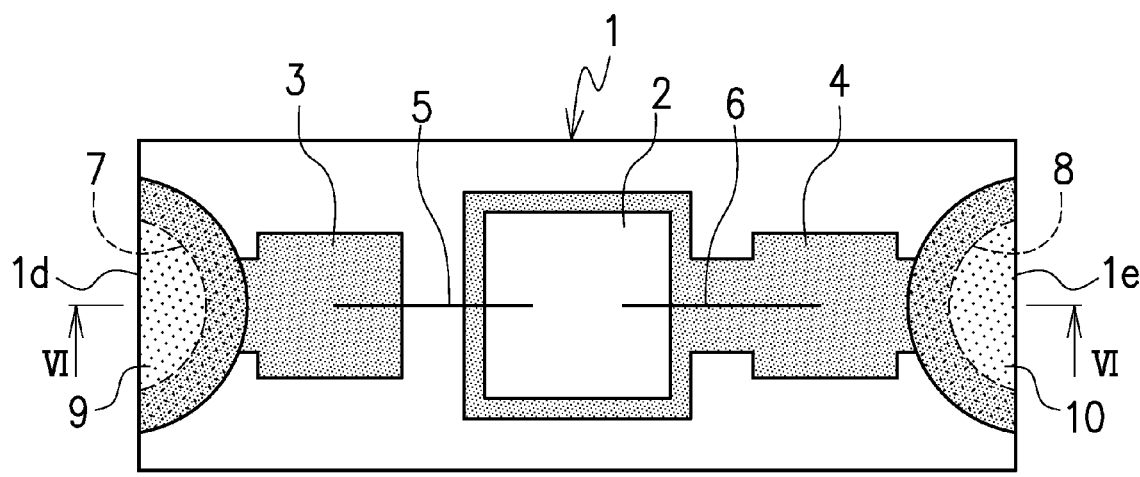
FIG. 5 is a plan view showing a reference example of a light-emitting device in which a semicircular through-hole is provided in each of opposite short sides of a rectangular substrate.
Figure 6:
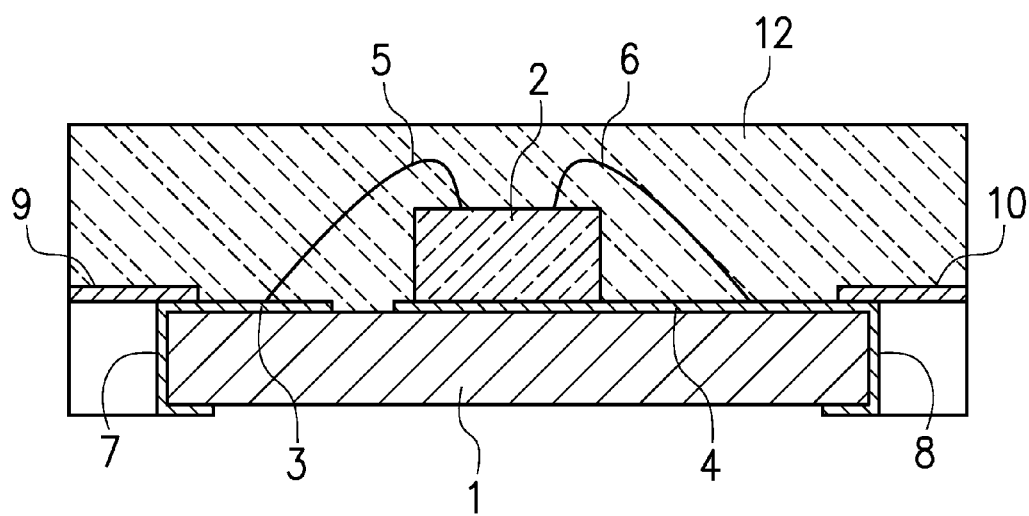
FIG. 6 is a sectional view taken along line VI-VI of the light-emitting device shown in FIG. 5.

FIG. 5 illustrates a reference example of a light-emitting device in which a first semicircular through-hole 7 is provided in a first short side 1d of a substrate 1 and a second semicircular through-hole 8 is provided in a second short side 1e of the substrate 1 opposite to the first short side 1d. If the semicircular through-holes 7 and 8 are provided in the opposite short sides 1d and 1e of the substrate 1, respectively, the substrate tends to be horizontally long, considering to perform the bonding securely. In fact, as shown in FIG. 7, the substrate becomes horizontally longer than the substrate 21 of the light-emitting device shown in each of the first embodiment and the second embodiment.

When a first electrode 3, a second electrode 4, the first semicircular through-hole 7, and the second semicircular through-hole 8 are arranged in a linear arrangement in a extending direction a first wire 5 and a second wire 6, it is necessary to secure a space for a wire bonding area to acquire a moving range of the capillary 11. As a result, it is difficult to miniaturize the substrate, when the semicircular through-holes are arranged in opposite sides of the substrate.

In contrast, in the light-emitting device of each of the foregoing embodiments, the through-holes 22 to 25 each in a shape of a quarter of circle are formed in two diagonally opposite corners or four corners of the substrate 21, it possible to miniaturize the substrate 21 efficiently, compared with the substrate including the semicircular through-holes provided in the opposite short sides of the substrate, as shown in the reference example.

Figure 7:
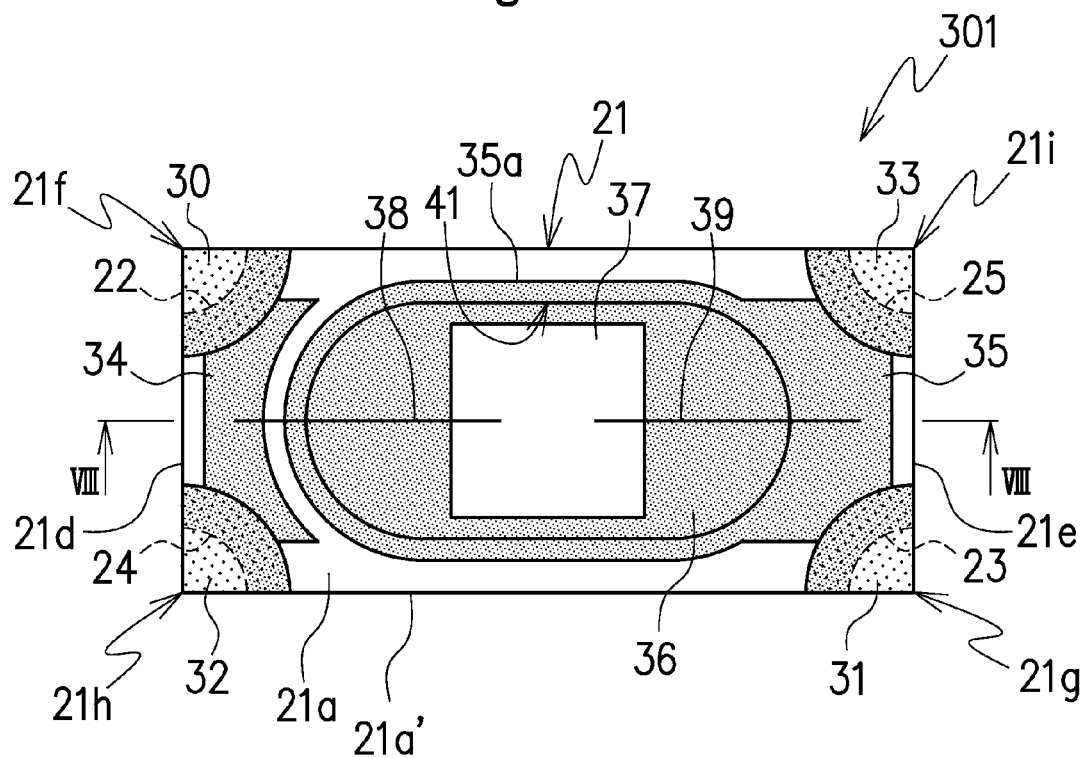
FIG. 7 is a plan view showing a light-emitting device according to a third embodiment of the present invention, in which a through-hole in a shape of a quarter of circle is provided in each of four corners of a rectangular substrate.
Figure 8:
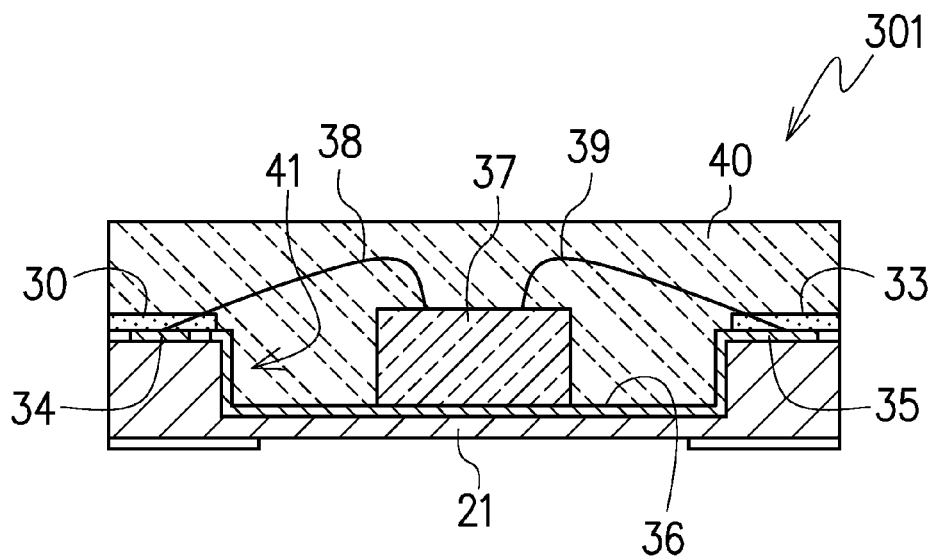
FIG. 8 is a sectional view taken along line VIII-VIII of the light-emitting device shown in FIG. 7.

FIGS. 7 and 8 illustrate a light-emitting device according to a third embodiment of the present invention.

The light-emitting device 301 in the third embodiment differs from the aforementioned first and second embodiments in that a hollow 41 positioned at a central area of the upper surface of the substrate. The light-emitting element 37 is provided in the hollow 41 of the substrate 21.

In the third embodiment, the hollow 41 includes an oval or an elongated circular shape (see FIG. 7) as viewed in a top plan view. The second electrode of the substrate 35 is extended to cover an inner surface 36 of the hollow 41, as shown in FIG. 8.

The light-emitting device 301 includes a first electrode 34 provided along the first short side 21d of the substrate 21 and a second electrode 35 provided along the second short side 21e of the substrate 21. The first electrode differs from that as shown in the first and second embodiments, has no extension extending to the central portion of the substrate 21, and has a hollow 41 provided on a surface facing the central portion of the substrate 21. The second electrode 35 has a second extension 35a which is electrically connected to the electrode layer 36 provided on the inner surface of the hollow 41.

As mentioned above, with the structure in which the hollow 41 is provided in the substrate 21 and the light-emitting element 37 is bonded to the electrode layer 36 in the hollow 41, it is possible to lower a height of the light-emitting device.

Figure 9:
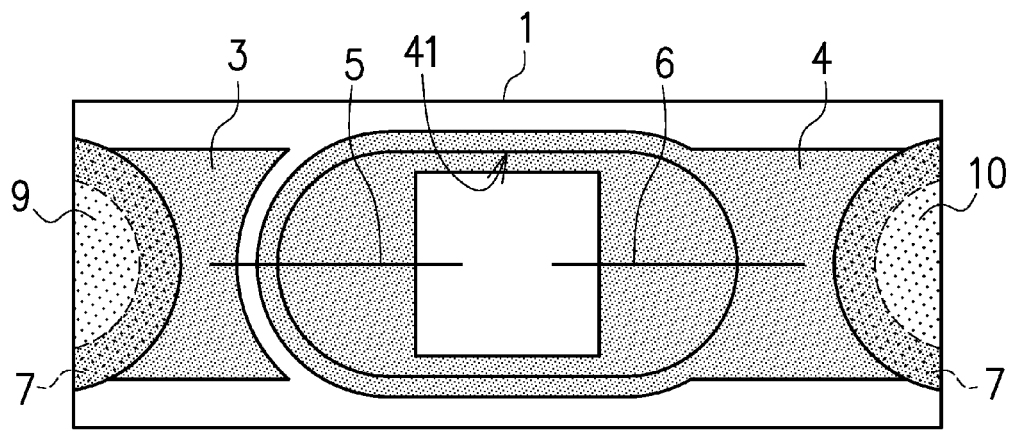
FIG. 9 is a plan view showing a reference example of a light-emitting device in which a semicircular through-hole is provided in each of opposite short sides of a rectangular substrate.
Figure 10:
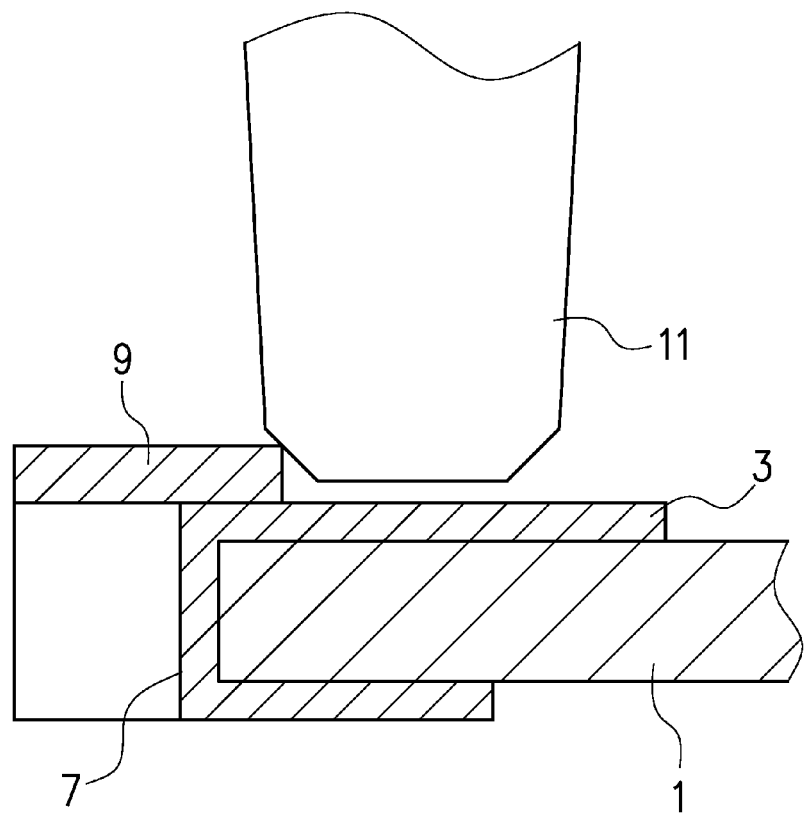
FIG. 10 is an enlarged sectional view showing a contacted state of a capillary and a dry film that is disposed on the upper surface of the substrate during wire bonding by the capillary.

FIG. 9 illustrates a reference example for comparing with the foregoing structure in the third embodiment. The reference example has a structure in which a first electrode 3, a second electrode 4, a first semicircular through-hole 7, and a second semicircular through-hole 8 are arranged in a direction of extending a first wire 5 and a second wire 6. In this structure, right and left end portions of the first electrode 3 between the first semicircular through-hole 7 and a left end portion of the oval hollow 41, and right and left end portions of the second electrode 4 between the first semicircular through-hole 7 and a right end portion of the oval hollow 41, as shown in FIG. 9 are significantly reduced, and thus, areas of the first and second electrodes 3 and 4 become very small, and hence it is difficult to acquire a sufficient space for a wire bonding area.

In contrast, in the light-emitting device 301 according to the third embodiment as shown in FIG. 7, the first electrode 34 extends between the first through-hole 22 in a shape that is a quarter of circle and the third through-hole 24 in a shape that is a quarter of circle, and the second electrode 35 is disposed between the second through-hole 23 in a shape that is a quarter of circle and the fourth through-hole 25 in a shape that is a quarter of circle. Consequently, a capillary that draws the first wire 38 and the second wire 39 can move to positions adjacent to the first short side 21d and the second short side 21e of the substrate 21, without coming to contact with the first cover 30, the second cover 31, the third cover 32, and the fourth cover 33. Therefore, it is possible to prevent a trouble causing a malfunction of a product without increasing the size of a substrate.

In addition, if the through-holes are provided in the four corners of the substrate, because these through-holes are provided in the both ends of each of the opposite short sides of the substrate, it is possible to maintain the same mounting strength as in a case where semicircular through-holes are provided in the opposite short sides of the substrate.

Furthermore, even if an oval hollow in that the light-emitting element is disposed is provided in the central portion of the substrate, because the through-holes are provided at corners of the substrate, it is possible to acquire a space for the wire bonding.

Although the embodiments of the present invention have been described, the present invention is not limited to these embodiments, various modifications and changes can be made to the embodiments by those skilled in the art as long as such modifications and changes are within the scope of the present invention as defined by the Claims.

What is claimed is:

1. A light-emitting device comprising:
a substrate including an upper surface, a lower surface opposite to the upper surface, a peripheral side surface extending between peripheral edges of the upper surface and peripheral edges of the lower surface, a pair of electrodes as a first electrode and a second electrode that are disposed on the upper surface of the substrate; and
a light-emitting element including a pair of element electrodes as a first element electrode and a second element electrode and disposed on the second electrode of the substrate;
a pair of wires as a first wire and a second wire, the first wire electrically connecting the first electrode of the substrate and the first element electrode of the light-emitting element, and the second wire electrically connecting the second electrode of the substrate and the second element electrode of the light-emitting element;
a first through-hole in a shape that is a quarter of circle disposed at a first corner of the substrate and electrically connected to the first electrode of the substrate;
a second through-hole in a shape that is quarter of circle disposed at a second corner that is diagonally opposite to the first corner of the substrate and electrically connected to the second electrode of the substrate;
a first cover in a shape that is a quarter of circle disposed on the upper surface of the substrate and covering the first through-hole at the first corner of the substrate; and
a second cover in a shape that is a quarter of circle disposed on the upper surface of the substrate and covering the second through-hole at the second corner of the substrate.

2. The light-emitting device according to claim 1 further comprising:
a third through-hole in a shape that is a quarter of circle disposed at a third corner of the substrate and electrically connected to the first electrode of the substrate;
a fourth through-hole in a shape that is a quarter of circle disposed at a fourth corner diagonally opposite to the third corner of the substrate and electrically connected to the second electrode of the substrate;
a third cover in a shape that is a quarter of circle disposed on the upper surface of the substrate and covering the third through-hole disposed at the third corner of the substrate;
a fourth cover in a shape that is a quarter of circle disposed on the upper surface of the substrate and covering the fourth through-hole at the fourth corner of the substrate.

3. The light-emitting device according to claim 2:
wherein the first wire is bonded from the first element electrode of the light-emitting element to the first electrode of the substrate at a position between the first cover and the third cover, and the second wire is bonded from the second element electrode of the light-emitting element and to the second electrode of the substrate at a position between the second cover and the fourth cover.

4. The light-emitting device according to claim 1:
the first cover in a shape that is a quarter of circle disposed on the upper surface of the substrate at the first through-hole, and the first through-hole including an arc strip portion that is flush with an arc side of the first cover at an outer arc of the arc strip portion.

5. The light-emitting device according to claim 3:
the peripheral surface of the substrate including a first side and a second side that is opposite to the first side, a third side and a fourth side that is opposite to the third side, and the first side and the second side being shorter than the third side and the fourth side and;
the first side of the substrate including a space free from the first cover and the third cover in a direction of bonding the first wire from the first element electrode to the first electrode of the substrate; and the second side of the substrate including a space free from the second cover and the fourth cover in a direction of bonding the second wire from the second element electrode to the second electrode of the substrate.

6. The light-emitting device according to claim 1:
the substrate further including a hollow positioned at a central area of the upper surface of the substrate.

7. The light-emitting device according to claim 6:
the second electrode of the substrate extended in the hollow and the light-emitting element being disposed on the second electrode in the hollow.

8. The light-emitting device according to claim 6:
wherein the hollow is in a shape of oval.

* * * * *

UNITED STATES PATENT AND TRADEMARK OFFICE
CERTIFICATE OF CORRECTION

PATENT NO. : 8,558,454 B2
APPLICATION NO. : 13/624198
DATED : October 15, 2013
INVENTOR(S) : Yu Kamijo It is certified that error appears in the above-identified patent and that said Letters Patent is hereby corrected as shown below:

On the Title Page,

At Item (73) Assignees, delete the second assignee name "Citizen Holdings Co., Ltd," and insert --Citizen Holdings Co., Ltd.--.

At Item (57) Abstract, at line 2, delete "through-holes" and insert --through-hole--.

Signed and Sealed this
Twenty-fourth Day of June, 2014

Michelle K. Lee
*Deputy Director of the United States Patent and Trademark Office*